United States Patent
Sparks et al.

(10) Patent No.: US 6,858,542 B2
(45) Date of Patent: Feb. 22, 2005

(54) SEMICONDUCTOR FABRICATION METHOD FOR MAKING SMALL FEATURES

(75) Inventors: Terry G. Sparks, Austin, TX (US); Ajay Singhal, Round Rock, TX (US); Kirk J. Strozewski, Round Rock, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 36 days.

(21) Appl. No.: 10/346,263

(22) Filed: Jan. 17, 2003

(65) Prior Publication Data

US 2004/0142576 A1 Jul. 22, 2004

(51) Int. Cl.⁷ .............................................. H01L 21/311
(52) U.S. Cl. ...................... 438/701; 438/947; 438/976; 438/978
(58) Field of Search ................................. 438/701, 673, 438/976, 978, 618, 947, FOR 458, FOR 492; 430/316; 257/E21.039

(56) References Cited

U.S. PATENT DOCUMENTS

| 4,061,530 A | * | 12/1977 | Hosack | 438/587 |
| 4,814,041 A | * | 3/1989 | Auda | 438/712 |
| 5,196,376 A | * | 3/1993 | Reche | 216/18 |
| 5,256,248 A | * | 10/1993 | Jun | 438/703 |
| 6,251,734 B1 | * | 6/2001 | Grivna et al. | 438/296 |
| 6,313,019 B1 | * | 11/2001 | Subramanian et al. | 438/585 |
| 6,329,109 B1 | * | 12/2001 | Figura et al. | 430/11 |
| 6,432,832 B1 | * | 8/2002 | Miller et al. | 438/713 |
| 6,541,360 B1 | * | 4/2003 | Plat et al. | 438/585 |
| 2002/0151179 A1 | * | 10/2002 | Juengling | 438/701 |
| 2003/0059994 A1 | * | 3/2003 | Juengling | 438/197 |
| 2003/0113978 A1 | * | 6/2003 | Song | 438/400 |

* cited by examiner

Primary Examiner—George Fourson
Assistant Examiner—Michelle Estrada
(74) Attorney, Agent, or Firm—Joseph P. Lally

(57) ABSTRACT

A semiconductor fabrication method that includes forming a film (109) comprising an imaging layer (112) and an under layer (110) over a semiconductor substrate (102). The imaging layer (112) is patterned to produce a printed feature (116) having a printed dimension (124). The under layer (110) is then processed to produce a sloped sidewall void (120) in the under layer (110) wherein the void (120) has a finished dimension (126) in proximity to the underlying substrate that is less than the printed dimension. Processing the under layer (110) may include exposing the wafer to high density low pressure $N_2$ plasma.

19 Claims, 2 Drawing Sheets

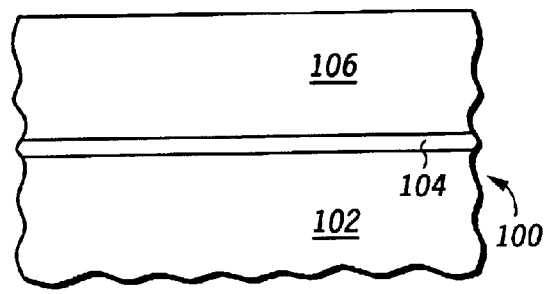
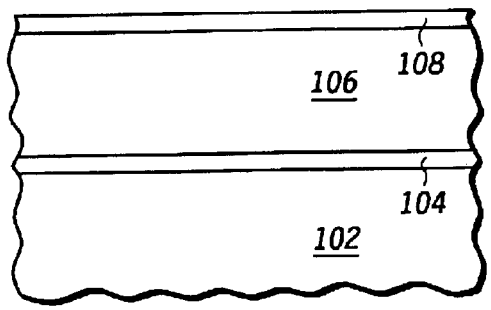
FIG.1    FIG.2
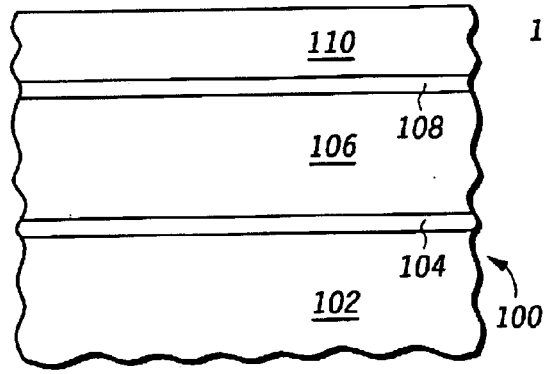
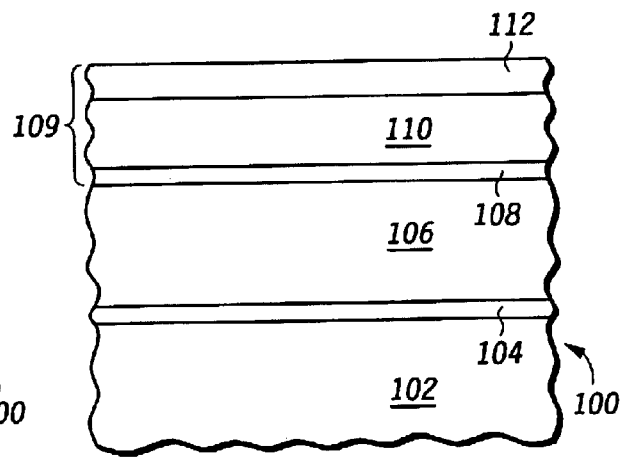
FIG.3    FIG.4
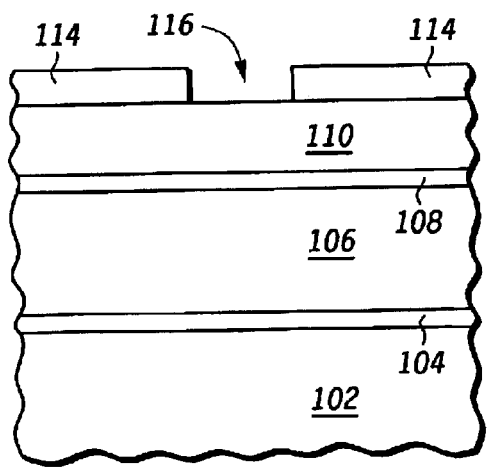
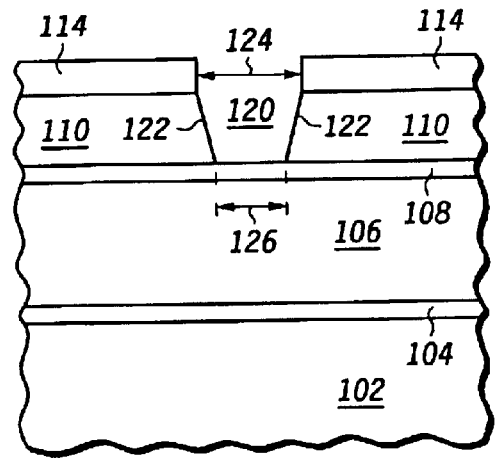
FIG.5    FIG.6

SEMICONDUCTOR FABRICATION METHOD FOR MAKING SMALL FEATURES

BACKGROUND OF THE INVENTION

1. Field of the Invention

The present invention is in the field of semiconductor fabrication and more particularly in the field of producing small features in a semiconductor device.

2. Description of Related Art

In the field of semiconductor fabrication, an important characteristic of any fabrication process is the minimum feature size that can be produced reliably with the process. The minimum feature size dictates, to a large extent, not only the performance or speed of an integrated circuit device, but also the size of the device. The size and speed of an integrated circuit device are critical parameters. Accordingly, it is generally is desirable in any fabrication facility to be able to produce increasingly smaller features.

One traditional method of reducing feature sizes has been to replace existing photolithography equipment (commonly referred to as steppers) with next generation steppers. The obvious drawback to this approach is the enormous amount of capital required to purchase, install, and qualify a new line of steppers. Consequently, replacing existing equipment is frequently cost prohibitive and manufacturers are always interested in implementing fabrication techniques that extend the useful life of their steppers.

Another problem associated with the fabrication of small features is related to defectivity. It is well known that, as minimum geometries shrink, the number of fatal defects will increase given the same level of defects in the fabrication facility. This is especially true in the area of photolithography where the use of photoresist and photoresist processing tend to generate a relatively large number of particles. It would be desirable to implement a process in which final or post-etch dimension of a feature is reliably smaller than the printed dimension of the corresponding photolithography feature.

SUMMARY OF THE INVENTION

The identified problems are addressed in the present invention by a semiconductor fabrication method that preferably includes forming a bilayer resist having an imaging layer and an under layer over a semiconductor substrate. The imaging layer is patterned to produce or define a printed feature having a printed dimension. The under layer is then processed to produce a sloped sidewall void in the under layer. The void has a finished dimension in proximity to the underlying substrate that is less than the printed dimension. In this manner, the under layer void exposes a geometry on the underlying substrate that is smaller than the size of the feature printed in the imaging layer thereby effectively shrinking the feature without altering the imaging equipment or exposure process. Processing the under layer may include exposing the wafer to a high density, low pressure $N_2$-based plasma maintained at a temperature of less than 10° C.

BRIEF DESCRIPTION OF THE DRAWINGS

The invention, together with further advantages thereof, may best be understood by reference to the following description taken in conjunction with the accompanying drawings in which:

FIG. 1 is a partial cross-sectional view of a semiconductor substrate over which an etch stop layer and a dielectric layer have been formed;

FIG. 2 illustrates processing subsequent to FIG. 1 in which a dielectric cappping layer is formed over the dielectric layer;

FIG. 3 illustrates processing subsequent to FIG. 2 in, which an under layer of a bilayer resist structure is coated over the wafer;

FIG. 4 illustrates processing subsequent to FIG. 3 in which an imaging layer of the bilayer resist structure is formed;

FIG. 5 illustrates processing subsequent to FIG. 4 in which the imaging layer is patterned by photolithography imaging;

FIG. 6 illustrates processing subsequent to FIG. 5 in which a tapered wall via is formed in the under layer of the bilayer resist;

DETAILED DESCRIPTION OF THE PREFERRED EMBODIMENTS

Figure 7:
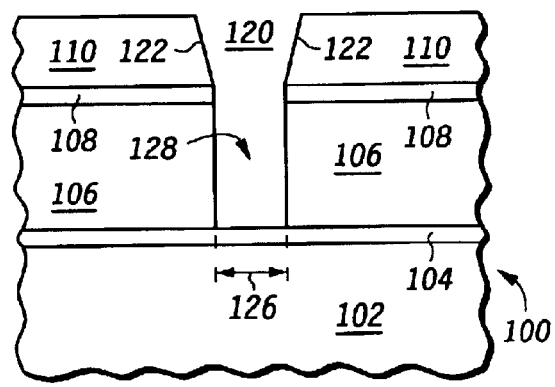
FIG. 7 illustrates processing subsequent to FIG. 6 in which a feature defined by the tapered wall via is formed in the underlying dielectric.

Reference will now be made in detail to presently preferred embodiments of the invention, examples of which are illustrated in the accompanying drawings. It should be noted that the drawings are in simplified form and are not to scale. Although the following description refers to the illustrated embodiments, it is to be understood that these embodiments are presented by way of example and not by way of limitation. The intent of the following detailed description is to cover all modifications, alternatives, and equivalents as may fall within the spirit and scope of the invention as defined by the appended claims.

It is to be understood and appreciated that the process steps and structures described herein do not cover a complete process flow for the manufacture of an integrated circuit. The present invention may be practiced in conjunction with various integrated circuit fabrication techniques that are conventionally used in the art, and only so much of the commonly practiced process steps are included herein as are necessary to provide an understanding of the present invention. Thus, for example, the following description does not address the interconnection of the transistors formed or other processing generally referred to as "back end" processing.

Generally speaking the present invention contemplates a semiconductor fabrication technique in which a feature is printed or defined in a photoresist film over a disposable film. The disposable film is then processed to produce an opening or void having tapered sidewalls. The tapered sidewalls terminate on an underlying substrate such that the dimension of the opening at the substrate interface is smaller than the dimension of the printed feature. The processing of the disposable film to produce the tapered sidewalls may include a high density, low pressure $N_2$-based plasma etch. After processing the disposable film, the substrate can then be etched with the processed disposable layer in place to produce an etched feature in the substrate. The etched feature has a dimension that is roughly equal to the dimension of the opening at the substrate interface (i.e., smaller than the printed dimension).

In this manner, at least two manufacturing improvements are realized. First, the processing technique may be used to produce feature sizes that are smaller than the minimum feature size that can be printed with an existing photolithography process. Second, the processing technique enables a manufacturer to produce small features with less defectivity. More specifically, the disclosed process may be used to increase the size of a photolithography feature without increasing the size of the finished feature. The relaxed photolithography processing will result in fewer defects.

Turning now to the drawings, FIGS. 1 through 8 illustrate a semiconductor fabrication processing sequence emphasizing significant aspects of the present invention. FIG. 1 is a partial, cross-sectional view of a semiconductor wafer 100 at an intermediate stage in the fabrication of an integrated circuit. As depicted in FIG. 1, wafer 100 includes a substrate 102 over which an etch stop layer (ESL) 104 and a dielectric layer 106 have been formed. Substrate 102 may include a monocrystalline silicon or other semiconductor substrate that has been processed to include a plurality of electronic devices typically including p-channel and n-channel metal-oxide-semiconductor field effect transistors (MOSFETs) and interspersed transistor isolation structures. In addition, substrate 102 may include one or more interconnect layers and one or more layers of interlevel dielectrics (ILDs) all as will be familiar to those in the field of semiconductor fabrication. Dielectric layer 106 and ESL 104 may also be referred to as comprising a portion of substrate 102.

In one embodiment, ESL 104 is a silicon-nitride (SiN) or carbon doped silicon-nitride (SiCN) layer having a thickness of approximately 500 angstroms. The silicon nitride may include plasma enhanced chemically vapor deposited (PECVD) silicon nitride produced by forming a plasma from ammonium and silane in a CVD reactor chamber maintained at a temperature in the range of approximately 300 to 500° C. Carbonated silicon nitride may be used in lieu of conventional silicon nitride when a lower dielectric constant material is desirable.

Dielectric layer 106 may include approximately 3000 to 9000 angstroms of an electrically insulating material such as silicon oxide ($SiO_2$) or carbonated silicon oxide (SiCOH). Dielectric 106 likely serves as an ILD layer between a pair of interconnects (not shown) disposed above and below it. In a silicon oxide embodiment of layer 106, the silicon oxide may be formed by CVD by decomposing tetraethylorthosilicate (TEOS), by reacting silane and oxygen, by reacting dichlorosilane and nitrous oxide, or by another suitable CVD oxide technique. The SiCOH embodiment of layer 106 may be employed as a low-K dielectric (a material having a dielectric constant of less than approximately 3.0) where it is desirable to reduce intralayer and interlayer capacitive coupling effects.

Turning now to FIG. 2, a capping layer 108 is formed over dielectric layer 106. Capping layer 108 may be incorporated into the process for at least two reasons. Dielectric layer 106, when serving as an ILD is typically subjected to some form of planarization process such as a chemical mechanical polish (CMP) process. Following the planarization, the deposition of capping layer 108 may be used to achieve a desired final ILD thickness where the final ILD includes dielectric layer 106 and capping layer 108. In embodiments where dielectric layer 106 is or includes a low-K material such as SiCOH, a relatively thin capping layer 108 may provide a stable film on which subsequent layers may be formed. In one embodiment, capping layer 108 comprises approximately 800 angstroms of TEOS-based silicon oxide.

With reference now to FIG. 3 and FIG. 4 a film 109 is formed over capping layer 108. Film 109 is a temporary film that will be removed before completion of the fabrication process. In one embodiment, film 109 is a bilayer photoresist (BLR) that includes a relatively thick light absorbing polymeric under layer or disposable film (UL) 110 and a relatively thin imaging layer (IL) 112. In one embodiment, IL 112 is a silicon containing photoresist imaging layer having a silicon content of approximately 6 to 15 percent by weight while UL 110 is a photo-insensitive polymer. Bilayer resists are used to compensate for the reduced depth of focus characteristic of photolithography systems that employ a short imaging wavelength (248 nm or less) and a large numerical aperture (NA) lens. Such systems are almost universally employed to produce geometries of 100 nm or less. In these systems, reducing the photoresist thickness to compensate for the reduced depth of focus is of limited effectiveness. If the resist is too thin, it cannot serve as a pattern transfer mask during the subsequent etch of the wafer. Bilayer resists address this problem by providing a thin film imaging layer and a thick, photo insensitive under layer. After patterning the imaging layer, the resulting pattern is transferred into the thick under layer using a special etch process that etches the under layer without substantially etching the imaging layer or the underlying substrate. An example of a commercially available bilayer resist is the SiBER™ resist system from Shipley Company, LLC.

In the embodiment depicted in FIG. 3 and FIG. 4, film 109 is formed by first coating wafer 100 with the polymeric UL 110. A thickness of UL 110 is preferably in the range of 3500 to 15000 angstroms. The coated UL is then baked at a temperature in the range of approximately 150 to 250° C. to cross-link the polymeric material and mechanically harden the film. Following the bake of UL 110, IL 112 is coated over UL 110. A thickness of IL 112 is preferably in the range of approximately 500 to 3000 angstroms. After coating the wafer with the imaging layer, IL 112 is baked at a temperature preferably in the range of 90 to 140° C. to form film 109 as depicted in FIG. 4.

The IL 112 is then exposed to imaging radiation through a conventional photomask and submersed in a suitable photoresist develop solution to selectively remove portions of IL and create a patterned IL 114 as shown in FIG. 5. The exposure of IL 112 may be performed, for example, with 248 nm or 193 nm lithography equipment. Patterned IL 114 defines a void or printed feature 116. The photolithographic processing of the imaging layer to produce patterned IL 114 leaves UL 110 substantially intact since UL 110 is not photosensitive.

Referring now to FIG. 6, the printed feature 116 in patterned IL 114 is transferred into UL 110 by processing UL 110 to create a void, referred to herein as tapered wall via 120 in UL 110. In one embodiment, processing referred to herein as dry develop processing is used to transfer printed feature 116 into UL 110. The dry develop processing of UL 110 employs chemistry and processing conditions that produce a tapered wall via 120 in UL 110 where tapered wall via 120 is characterized, as its name suggests, by tapered or sloping sidewalls 122. According to the present invention, sidewalls 122 are characteristically sloped at an angle between roughly 70° to 89° (relative to an upper surface of the underlying substrate) and substantially straight (as seen in cross section). The tapered sidewalls 122 of via 120 beneficially provide a mechanism for effectively defining an integrated circuit feature that is smaller than its corresponding printed feature 116. In other words, the processing of UL 110 forms a tapered wall via 120 that effectively shrinks the geometries of the integrated circuit feature relative to size of the printed feature.

In one embodiment, the dry develop processing of UL 110 may be carried out in a conventional plasma etch chamber such as a chamber used to dry etch silicon oxide. In the preferred embodiment, the etcher used for the dry develop processing of UL 110 is dedicated to such processing and is not used for other etch processing within the fabrication facility. In this "dedicated chamber" embodiment, it is theorized that dedicating the chamber to dry develop processing reduces defects and improves the efficiency of the dry develop process. In conventional bilayer processing, the under layer is developed or etched using an $O_2$ chemistry that tends to form vertical-sidewall or, even worse, bowed-sidewall voids. Vertical sidewall voids are not capable of achieving the feature size reduction benefit described above. Bowed-sidewall voids are ineffective because they are characterized by thin, overhanging portions of under layer material that tend to give way during the dry develop.

One embodiment of the present invention beneficially uses a high density $N_2$ plasma at low pressure for the dry develop processing of UL 110 to produce tapered wall via 120 as depicted in FIG. 6. For purposes of this disclosure, a high density plasma refers to a plasma having an ion density in excess of approximately $10^{11}$ ions/cm$^3$ and "low pressure" refers to a pressure of 15 mT or less. In one embodiment, the dry develop processing of UL 110 is carried out in an inductively coupled plasma reactor with an RF source power in excess of 500 W, an RF bias power in excess of 50 W, an $N_2$ flow rate of at least 20 sccm (no other gases are introduced into the chamber), a pressure of less than 15 mT, and a wafer (chuck) temperature of less than 10° C. The dry develop processing may, for example, use an RF source power of 500 to 2500 W, an RF bias power of 50 to 200 W, an $N_2$ flow of 20 to 100 sccm, a chamber pressure of 3 to 15 mT, and a wafer temperature of −10 to 10° C. It is theorized that the $N_2$ dry develop chemistry, in conjunction with the high density, low pressure plasma etch parameters, produces a higher concentration of nitrogen "neutrals" than do comparable $NH_3/O_2$ plasmas and that the plentiful nitrogen neutrals are responsible for producing the tapered sidewalls 122 in tapered wall via 120. At a UL thickness of approximately 5000 angstroms, the tapering of sidewalls 122 produced by the disclosed dry develop technique results in a feature size shrinkage of roughly 40 to 70 nm. Thus, the BLR dry develop processing technique disclosed herein may be used to create a tapered wall via 120 having a printed dimension (reference numeral 124) of approximately 170 mn and a final or lower dimension (126) of approximately 105 nm.

The formation of tapered wall via 120 provides at least two primary benefits. First, tapered wall via 120 may be used to form a final feature having a minimum feature size that is less than the minimum feature size that the photolithography can print. If the printed feature 116 in pattered IL 114 has a dimension that is roughly the minimum feature size that the stepper can print, the tapered wall via 120 will result in an integrated circuit feature formed in the underlying wafer with a minimum dimension that is less than the printable minimum dimension. Those skilled in the field of photolithography having the benefit of this disclosure will appreciate that, in this manner, tapered wall via 120 can extend the useful life of the photolithography equipment by providing alternative means to shrink the size of a printed feature. The tapered wall via 120 can also be used to reduce the number of fatal defects by enabling a relaxation of the photolithography parameters without effecting the performance or die size of the finished device. More specifically, tapered wall via can be used in conjunction with a photolithography process that prints features 116 with a dimension that is greater than the minimum dimension specified for feature 116. After completing the wafer etch processing, the feature produced in the wafer will have a minimum feature that is comparable to the minimum feature specified for feature 116.

Referring to FIG. 7, a feature 128 of the integrated circuit is formed in wafer 100 using an anisotropic etch process with UL 110 (and IL 112) as an etch mask after the dry develop processing of UL 110. Typically, a fluorine-based reactive ion etch (RIE) process is used to form integrated circuit feature 128. In the depicted embodiment, feature 128 is a via formed in the underlying dielectric 106 and capping layer 108. In alternative embodiments, a similarly processed void may serve as a trench from which an interconnect may be formed using a damascene process. The silicon containing embodiment of IL 114 is typically etched away during such an etch process leaving only the UL 110 over the wafer 100 including feature 128 as shown in FIG. 7. The etch process used will desirably produce substantially vertical sidewalls such that the finished dimension of void 120 is transferred into the underlying films. Thus, as shown in FIG. 7, feature 128 has a finished feature size (126) that is substantially equal to the finished dimension of tapered wall via 120 in UL 110.

Figure 8:
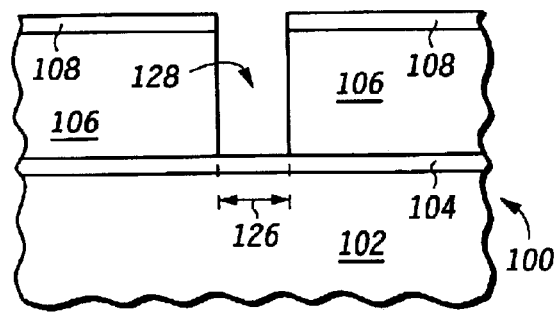
FIG. 8 illustrates processing subsequent to FIG. 7 in which the under layer is stripped from the wafer.

Referring to FIG. 8, the remaining portions of UL 110 are stripped from wafer 100 using a conventional photoresist strip solution. At this stage, wafer 100 is in condition for subsequent processing (not depicted) such as a metal deposition processing to fill feature 128 with a conductive material that may serve as a contact or an interconnect.

Thus it will be apparent to those skilled in the art having the benefit of this disclosure that there has been provided, in accordance with the invention, a process for fabricating smaller feature sizes without substantially altering the photolithography imaging process or equipment that achieves the advantages set forth above. Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications as fall within the scope of the appended claims and equivalents thereof.

What is claimed is:

1. A semiconductor fabrication method, comprising:
   forming a polymeric disposable film over a semiconductor substrate;
   forming a silicon-containing photoresist film on an upper surface of the disposable film;
   defining a feature having a printed dimension in the photoresist film; and
   processing the disposable film under the printed feature using the photoresist film with the defined feature as a mask to produce a void characterized by sloped sidewalls wherein a dimension of the void proximal to the substrate is smaller than the printed dimension.

2. The method of claim 1, wherein a thickness of the silicon-containing photoresist film is in the range from approximately 500 to 3000 angstroms.

3. The method of claim 2, wherein a silicon content of the photoresist layer is in the range of approximately 6 to 15 percent by weight.

4. The method of claim 2, wherein the disposable film comprises a photo insensitive polymer layer having a thickness of approximately 3500 to 5000 angstroms.

5. The method of claim 1, wherein processing the disposable film comprises exposing the film to a high density, low pressure plasma.

6. The method of claim 5, wherein the plasma is further characterized as a nitrogen ($N_2$) plasma.

7. The method of claim 6, wherein the semiconductor substrate is maintained at a temperature of less than 10° C. during the processing of the disposable film.

8. A semiconductor fabrication method, comprising:

forming a bilayer resist comprising an imaging layer and an under layer over a semiconductor substrate;

patterning the imaging layer to produce a printed feature having a printed dimension; and exposing the water to a $N_2$-based plasma in a plasma reactor chamber to produce a void in the under layer wherein the void has a finished dimension in proximity to the underlying substrate, wherein the finished dimension of the void is less than the printed dimension; and etching the substrate using the under layer as an etch mask to form an integrated circuit feature in the substrate wherein dimension of the integrated circuit feature is determined by the finished dimension of the under layer void.

9. The method of claim 8, wherein the imaging layer comprises a silicon-containing photoresist having a thickness of approximately 500 to 3000 angstroms.

10. The method of claim 9, wherein a silicon content of the imaging layer is in the range of approximately 6 to 15 percent by weight.

11. The method of claim 9, wherein the under layer comprises a polymer layer having a thickness of approximately 3500 to 15000 angstroms.

12. The method of claim 8, wherein $N_2$ is the only gas introduced into the chamber during the processing of the under layer.

13. The method of claim 8, wherein the semiconductor substrate is maintained at a temperature of less than 10° C.

14. The method of claim 8, wherein the reactor is maintained at a pressure of less than 15 mT.

15. The method of claim 8, wherein the under layer void is characterized by sloped and substantially straight sidewalls having a slope between approximately 70° to 89° relative to an upper surface of the substrate.

16. A semiconductor fabrication method, comprising:

forming a polymeric disposable film over a semiconductor substrate;

forming a photoresist film on an upper surface of the disposable film;

defining an opening having a printed dimension in the photoresist film over the disposable film;

processing the disposable film under the opening with a high density nitrogen plasma to produce a void characterized by sloped sidewalls wherein a dimension of the void proximal to the substrate is smaller than the printed dimension; and etching the substrate using the processed disposable layer as an etch mask to form an integrated circuit feature in the substrate wherein a dimension of the integrated circuit feature is determined by the dimension of the void proximal to the substrate.

17. The method of claim 16, wherein the disposable film comprises a photo insensitive polymeric film and wherein the photoresist film comprises a silicon-containing photoresist.

18. The method of claim 17, wherein a thickness of the silicon-containing photoresist is in the range of approximately 500 to 3000 angstroms and a thickness of the polymer film is in the range of 3500 to 15000 angstroms.

19. The method of claim 16, wherein processing the disposable layer is further characterized as processing the disposable layer with a plasma density in excess of $10^{11}$ ions/cm$^3$ at a pressure of less than 15 mT and a temperature of less than 10° C.

* * * * *

UNITED STATES PATENT AND TRADEMARK OFFICE
CERTIFICATE OF CORRECTION

PATENT NO. : 6,858,542 B2  Page 1 of 1
APPLICATION NO. : 10/346263
DATED : January 17, 2003
INVENTOR(S) : Terry G. Sparks et al.

It is certified that error appears in the above-identified patent and that said Letters Patent is hereby corrected as shown below:

Column 7, Line 11, Claim No. 8:
    Change "the water to a" to --the wafer to a--

Signed and Sealed this

Sixth Day of May, 2008

JON W. DUDAS
*Director of the United States Patent and Trademark Office*

UNITED STATES PATENT AND TRADEMARK OFFICE
CERTIFICATE OF CORRECTION

| | | |
|---|---|---|
| PATENT NO. | : 6,858,542 B2 | Page 1 of 1 |
| APPLICATION NO. | : 10/346263 | |
| DATED | : February 22, 2005 | |
| INVENTOR(S) | : Terry G. Sparks et al. | |

It is certified that error appears in the above-identified patent and that said Letters Patent is hereby corrected as shown below:

Column 7, Line 11, Claim No. 8:
    Change "the water to a" to --the wafer to a--

This certificate supersedes the Certificate of Correction issued May 6, 2008.

Signed and Sealed this

Third Day of June, 2008

JON W. DUDAS
*Director of the United States Patent and Trademark Office*